United States Patent [19]

Lee

[11] Patent Number: 4,866,685
[45] Date of Patent: Sep. 12, 1989

[54] PRINTED CIRCUIT BOARD FABRICATION TECHNIQUE

[75] Inventor: Wha-Joon Lee, Lawrenceville, N.J.

[73] Assignee: American Telephone and Telegraph Company, AT&T Bell Laboratories, Murray Hill, N.J.

[21] Appl. No.: 305,138

[22] Filed: Feb. 2, 1989

Related U.S. Application Data

[62] Division of Ser. No. 169,543, Mar. 17, 1988.

[51] Int. Cl.⁴ .................... G04F 8/00; G04F 10/00
[52] U.S. Cl. ................................. 368/117; 368/120
[58] Field of Search ............................ 368/113–120

[56] References Cited

U.S. PATENT DOCUMENTS

| | | | |
|---|---|---|---|
| 3,348,191 | 10/1967 | Jenson et al. | 368/118 |
| 3,896,378 | 7/1975 | Bedford | 368/120 |
| 4,736,351 | 4/1988 | Oliver | 368/120 |

Primary Examiner—Bernard Roskoski
Attorney, Agent, or Firm—Robert B. Levy

[57] ABSTRACT

The fabrication of a printed circuit board (26) usually includes the step of testing the board with a testing machine (24) to verify operability. The testing machine accomplishes such testing by transmitting test signals to the board via a transmission line (36) and then analyzing each response signals returned from the board in response to the test signals. To reduce the incidence of error, the testing machine (24) is compensated for the propagation delay of the line (12) which is measured by launching a first string of pulses into one end of the line whose opposite end is left open. A second string of pulses is sinultaneously launched into a programmable delay line (16) which delays each second pulse by an adjustable interval. After the generation of each first and second pulse, a check is made whether the first pulse has been reflected back to the first end of the transmission line at the same time the second pulse reaches the output of the delay line. If the pulses are not coincident, the delay setting of the delay line is increased and then a check is again made whether one of the first and second pulses are coincident. The delay of the delay line is successively increased until the pulse are coincident whereupon the delay of the delay line now equals twice the delay of the transmission line.

6 Claims, 2 Drawing Sheets

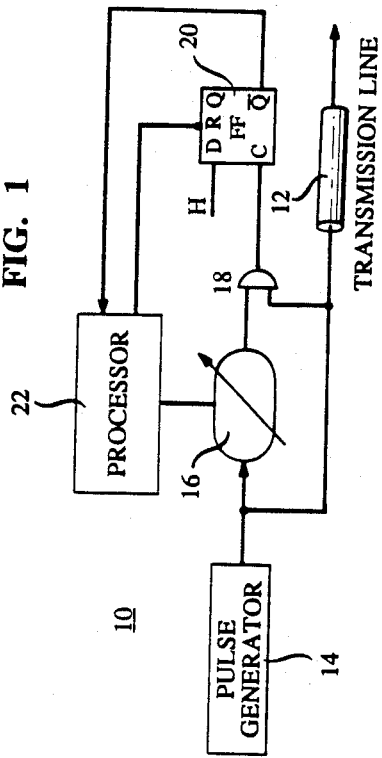
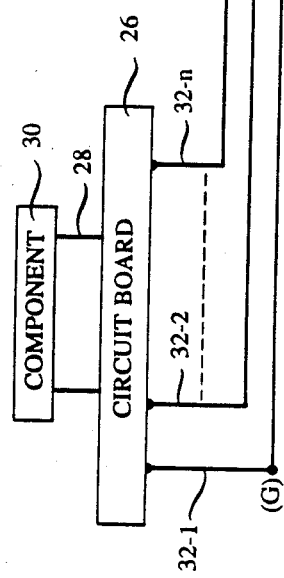
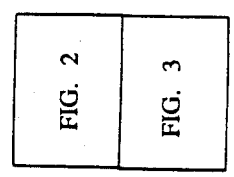

PRINTED CIRCUIT BOARD FABRICATION TECHNIQUE

This is a division of application Ser. No. 07/169,543 filed Mar. 17, 1988, pending.

TECHNICAL FIELD

This invention relates to a technique for fabricating a printed circuit board, and more particularly, to a technique for testing a board using a testing machine that is adjusted to compensate for the propagation delay of signals communicated between the testing machine and the board.

BACKGROUND ART

Printed circuit boards are commonly fabricated by solder bonding each lead of an electronic component to a corresponding one of a plurality of selectively interconnected, metallized areas on a major surface of an insulative substrate, such as FR-4 or the like. To assure that each circuit board operates properly, each board is routinely tested following soldering of the component leads. Typically, the testing is carried out with the aid of an automatic testing machine which serves to launch pulsed test signals into the circuit board via a transmission line, such as a coaxial cable. Once the test signals are launched, the testing machine monitors the circuit board to sense the phase and amplitude of each signal returned from the board in response to each test signal. The phase of each response signal is measured in accordance with the amount of time the signal lags the corresponding test signal. By monitoring the phase and amplitude of the response signals, the testing machine can determine if the circuit board is operating correctly.

Presently, there is a trend towards higher component operating frequencies which allow for higher circuit board operating frequencies. As the operating frequency of the circuit board increases, so too must the frequency of the test signals launched into the board to assure testing of the board at its operating frequency. At very high frequencies, the propagation delay of signals traveling between the testing machine and the circuit board under test often is a significant source of error during testing. Therefore, it is desirable to compensate the testing machine for such propagation delays.

To accurately compensate for the propagation delays, the magnitude of such delays must be known. In the past, such propagation delays have been measured by the technique of time domain reflectometry which relies on the principle that a signal launched into one end of a circuit path is reflected back from the other end of the path when left open or unconnected. However, prior art calibration techniques are generally very complex and do not afford a high degree of precision, which is necessary to measure propagation delays at very high frequencies.

Therefore, there is a need for a technique for automatically measuring the propagation delays incurred by signals traveling along a circuit path with a high degree of precision using time domain reflectometry techniques.

BRIEF SUMMARY OF THE INVENTION

In accordance with the invention, the propagation delay incurred by signals traveling along a circuit path is automatically measured very precisely by launching a first pulse into one end of the path whose other end is left open or unconnected. Simultaneously, a second pulse is launched into one end of a programmable delay line which delays the second pulse from reaching the opposite end of the delay line by a precise time interval which is adjustable. A check is then made whether the second pulse has reached the end of the delay line at the same time the first pulse has been reflected back to the first end of the circuit path. If the pulses do not coincide, then the delay interval of the programmable delay line is adjusted by a predetermined amount. Thereafter, the steps of: (a) launching the first pulse, (b) launching the second pulse, (c) checking whether the first pulse is delayed by the same interval as the second pulse, and (d) incrementing the delay of the delay line, are repeated until both pulses have been delayed by the same interval. When the first and second pulses are delayed by the same interval, then the delay interval of the programmable delay line equals twice the propagation delay of the circuit path.

The above method can be advantageously employed to measure the propagation delay of different circuit paths within an automatic testing machine. Once the propagation delays have been measured, appropriate adjustments can be made to the testing machine to compensate for such delays.

BRIEF SUMMARY OF THE DRAWINGS

FIG. 1 is a block diagram of an apparatus, in accordance with the invention, for measuring the propagation delay of a signal traveling along a circuit path; and FIGS. 2 and 3 together comprise a block diagram of conventional automatic test machine which is calibrated by the measurement apparatus of FIG. 1; and FIG. 4 illustrates the manner in which FIGS. 3 and 4 are to be viewed together.

DETAILED DESCRIPTION

Figure 3:
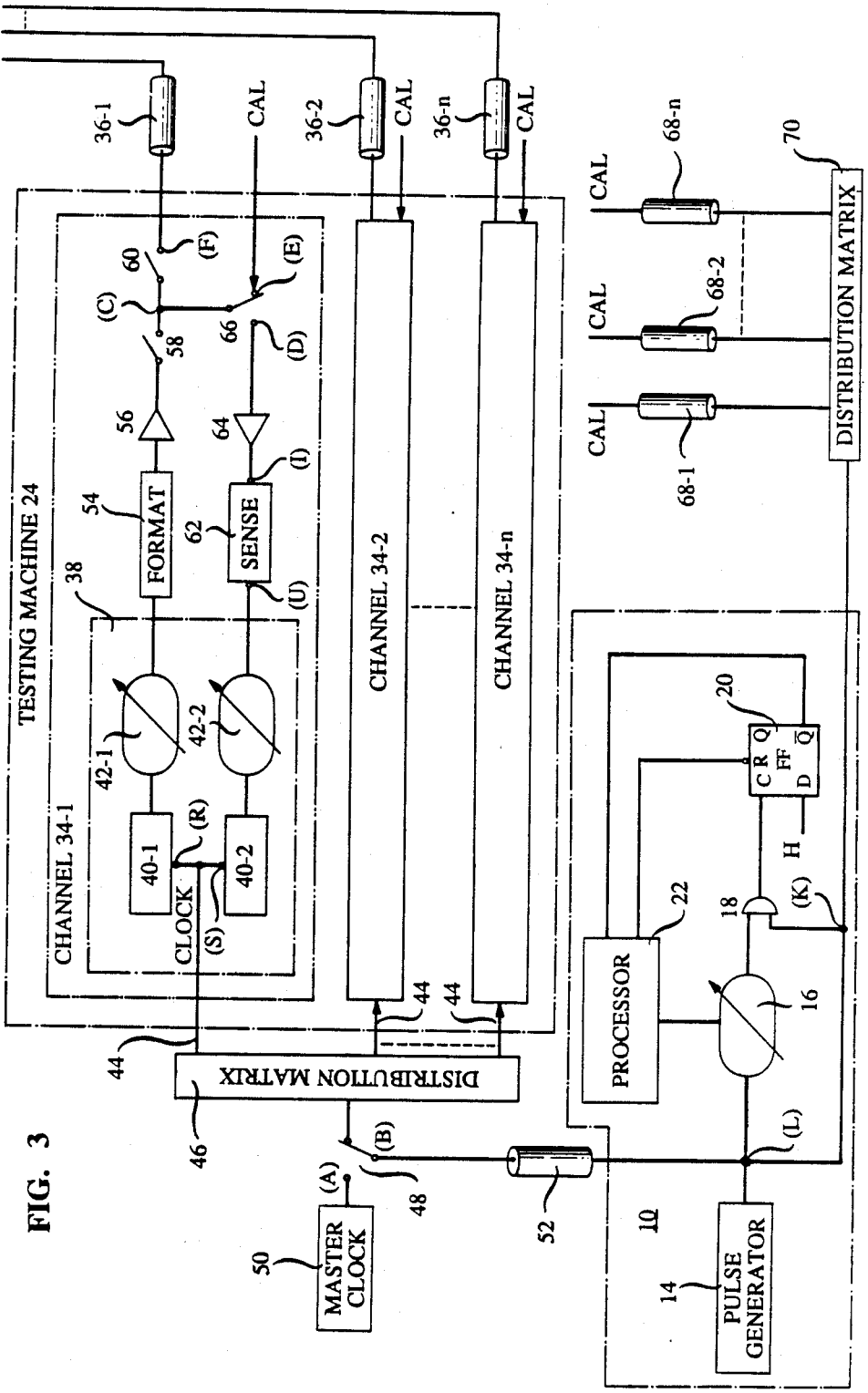

FIG. 1 is a block schematic diagram of an apparatus 10, in accordance with the present invention, for measuring the propagation delay of signals traveling through a circuit path 12, such as a length of transmission line. The apparatus 10 includes a pulse generator 14 for supplying a string of first pulses to one end of the transmission line 12 whose opposite end is left unconnected. The pulse generator 14 simultaneously supplies a string of second pulses to the input of a programmable delay line 16 which delays the pulse from reaching its output by an interval which varies in accordance with the value of a digital control signal input to the delay line. The programmable delay line 16 typically takes the form of a model SPECLDL-298 programmable delay line manufactured by Engineered Components, located in San Luis Obispo, CA, which has a resolution on the order of 100 picoseconds.

The delay line 16 has its output coupled to a first input of a two input AND gate 18. The AND gate 18 has its second input coupled to the same end of the transmission line 12 that is connected to the pulse generator 14. The AND gate output is coupled to a clock input of a high-speed, D-type flip-flop 20. The flip-flop 20 has its D input supplied with a signal H which is at a logic "high" level. A processor 22, typically taking the form of a microprocessor, is coupled to the reset input and the Q output of the flip-flop 20, and to the programmable delay line 16. The processor 22 supplies the programmable delay line 16 with a control signal for controlling the duration of the delay imposed by the delay line in accordance with the level of the Q output signal of the flip-flop 20. The processor 22 also serves to reset the flip-flop 20 when the latter becomes set, as will be described hereinafter.

At the outset of the operation of the apparatus 10, the programmable delay line 16 is initially set by the processor 22 to impose substantially no delay on the pulses traveling therethrough. Thereafter, the pulse generator 14 simultaneously supplies the string of first pulses to the first end of the transmission line 12 and the string of second pulses to the input of the programmable delay line 16. With the delay line 16 initially set to provide no delay, each second pulse passes through the delay line 16 with substantially no delay and thus appears almost instantly at the second input to the AND gate 18. Each first pulse propagates through the transmission line 12 until it reaches the open end of the line, whereupon the pulse is reflected back to the first end and hence to the first input of the AND gate 18. The time interval required for each first pulse to travel to and from the open end of the transmission line 12 corresponds to twice the propagation delay of the transmission line.

If the time required for each first pulse to travel to and from the open end of the transmission line 12 exceeds the time for each second pulse to travel through the delay line 16, then the output signal of the AND gate 18 remains at a logic "low" level. Hence, the flip-flop 20 continues to produce a logic "low" level signal at its Q output. Under these conditions, the processor 22 causes the delay line 16 to additionally delay each first pulse passing through the line by an incremental interval, typically 0.1 nanoseconds, while at the same time recording the cumulative delay imposed by the delay line.

The steps of: (1) incrementing the delay of the delay line 16, and (2) checking whether the two pulses are delayed by the same interval, are successively repeated until each second pulse is delayed by the same interval as each first pulse, so that each first and second pulse appears at the AND gate 18 simultaneously. When this occurs, the AND gate 18 generates a logic "high" level pulse which clocks the flip-flop 20. When the flip-flop 20 is clocked, the Q output signal produced by the flip-flop changes to a "high" level. As a result, the processor 22 ceases to increment the delay of the delay line 16. The current delay of the delay line 16 now equals twice the propagation delay of the line 12. By dividing the delay of the delay line 16 by two, the propagation delay of the line 12 can be determined by the processor 22. Once the delay has been calculated, the flip-flop 20 is then reset.

The degree of precision of the measurement of the propagation delay of the transmission line 12 depends in part on the resolution of the delay line 16. Since the delay line 16 has a high resolution ($\sim$100 picoseconds), very accurate propagation delay measurements can be made by the apparatus 10. In addition, the use of the processor 22 to detect whether the flip-flop 20 has been clocked, and to increment the delay of the delay line 16 while the flip-flop remains unclocked, allows such measurement to be made automatically.

Referring jointly to FIGS. 2 and 3 (which should be viewed in the manner depicted in FIG. 4), the apparatus 10 can be readily employed to calibrate a conventional automatic testing machine 24 of the type employed to test a printed circuit board 26. Usually, such testing occurs after each lead 28 of each component 30 on the circuit board 26 is soldered to a separate one of a plurality of metallized areas or nodes 32-1, 32-2, . . . 32-N (where n is an integer) on the board. The testing machine 26 typically comprises a plurality of channels 34-1, 34-2, . . . 34-N. Each of the channels 34-1, 34-2, . . . 34-N is coupled to a first end (node F) of a separate one of a plurality of transmission lines 36-1, 36-2, . . . 36-N, each having its second end (node G) coupled to a separate one of the nodes 32-1, 32-2, . . . 32-N on the printed circuit board 26.

The channels 34-1, 34-2, . . . 34-N are identical to each other and therefore only the channel 34-1 will be described in detail. The channel 34-1 comprises a timing generator 38 which includes a pair of a logic gates 40-1 and 40-2 coupled to a separate one of a pair of programmable delay lines 42-1 and 42-2, each similar to the delay line 16. The logic gates 40-1 and 40-2 have their clock inputs (nodes R and S, respectively) coupled via a single cable 44 to a distribution matrix 46 which serves to couple the logic gates of all of the channels 34-1, 34-2, . . . 34-N to a single switch 48. The switch 48 selectively couples the input of the distribution matrix 46 to either the output (node A) of a master clock 50 or to one end (node B) of a cable 52. The opposite end of the cable 52 is coupled to the output (node L) of the pulse generator 14 of the measurement apparatus 10.

The master clock 50 serves to supply periodic timing pulses to the logic gates 40-1 and 40-2. When supplied with a timing pulse from the master clock 50, the logic gate 40-1 produces a signal which is delayed by the delay line 42-1. The signal from the delay line 42-1 is supplied to a formatter circuit 54 which produces a string of test signal pulses. The test signal pulses from the formatter circuit 54 are coupled through an amplifier 56 and a pair of serially coupled switches 58 and 60 to one end (node F) of the cable 36-1. The opposite end (node G) of the cable 36-1 is coupled to the node 32-1 on the circuit board 26.

Like the logic gate 40-1, the logic gate 40-2 produces a logic signal in accordance with the pulse supplied from the master clock 50. The logic signal from the logic gate 40-2 is delayed by the delay line 42-2 before being supplied to a sense circuit 62. The sense circuit 62 functions to capture a signal at its signal input (node I) each time the sense circuit is strobed, that is, each time it receives a signal at its strobe input (node U) from the delay line 42-2. The signal input (node I) to the sense circuit 62 is coupled by an amplifier 64 to a first stationary contact (node D) of a single-pole, double-throw switch 66 whose contactor is coupled to the junction (node C) between the switches 58 and 60. The switch 66 has a second stationary contact (node E) coupled to one end of a separate one of a set of cables 68-1, 68-2, . . . 69-N. Each of the cables 68-1, 68-2, . . . 68-N has its opposite end coupled via a distribution matrix 70 to the junction (node K) of the pulse generator 14 and the AND gate 18.

Normal operation of the testing machine 24 is effectuated by closing the switches 58 and 60 and actuating the switches 48 and 66 to couple the master clock 50 to each of the channels 34-1, 34-2, . . . 34-N and to couple the junction of the switches 58 and 60 to the amplifier 68, respectively. In this way, test signal pulses from the formatter circuit 54 of each of the channels 34-1, 34-2, . . . 34-N propagate through a corresponding one of the cables 36-1, 36-2, . . . 36-N to a separate one of the nodes 32-1, 32-2, . . . 32-N on the circuit board 26. Response signals produced by the circuit board 26 in response to the test signals are carried by each of the cables 36-1, 36-2, . . . 36-N to a separate one of the channels 34-1, 34-2, . . . 34-N for capture by the respective sense circuit 66.

There are two different types of major errors that often plague the testing machine 24. The first type of error, referred to as "drive-phase channel-to-channel skew," arises when there is a difference in phase between the test signals produced by different ones of the channels 34-1, 34-2, . . . 34-N. The other type of error, referred to as "window-to-drive skew," occurs when the sense circuit 66 fails to detect a response signal within the period between successive clock signals from the master clock 50 because of the propagation delay imposed by the corresponding one of the cables 36-1, 36-2, . . . 36-N. These two errors can be substantially eliminated by adjusting a separate one of the programmable delay lines 42-1 and 42-2, respectively, within each of the channels 34-1, 34-2 . . . 34-N with the aid of the apparatus 10.

The drive-phase channel-to-channel skew is minimized by adjusting the delay line 42-1 within each of the channels 34-1, 34-2, . . . 34-N so the interval $T_{LBRCFG}$ for a signal to traverse a path connecting the nodes L,B,R,C,F and G for each channel is the same. It is assumed that the nodes C and F are very closely spaced so that the propagation delay therebetween is negligible. To properly adjust each delay line 42-1, the actual value of $T_{LBRCFG}$ for the corresponding one of the channels 34-1, 34-2, . . . 34-N must be known. The value of $T_{LBRCFG}$ can be determined from the sum of $T_{FG}$, and the difference between $T_{LBRCEK}$ and $T_{KECF}$ where:

$T_{FG}$ is the time for a signal to travel the path connecting the nodes F and G;

$T_{LBRCEK}$ is the time for a signal to travel the path connecting the modes L,B,R,C,E and K; and $T_{KECF}$ is the time required for a signal to travel the path connecting the nodes K,E,C and F.

The value of $T_{KCEF}$ can be determined from the difference between $T_{KCEFG}$ and $T_{FG}$, where $T_{KCEFG}$ is the time for a signal to travel along the path connecting the nodes K,C,E,F, and G. Advantageously, the time interval $T_{KCEFG}$ can be measured very precisely with the aid of the measuring apparatus 10, using the principle of time domain reflectometry as follows:

Beginning with the channel 34-1, the switches 58 and 60 are open and closed, respectively. The switch 66 is actuated to couple the end of the cable 68-1 to the first end (node F) of the cable 36-1. To measure the time $T_{KECFG}$, the pulse generator 14 launches a first and second string of periodic pulses into the programmable delay line 16 and the cable 68-1, respectively. While the pulses in the first and second string propagate through the delay line 16 and the cable 68-1, respectively, the processor 22 continuously monitors the status of the flip-flop 20.

As long as the flip-flop 20 has yet to be clocked, then the processor 22 successively increments the delay setting of the delay line 16. Once one of the pulses in the first string reaches the first input of the AND gate 18 at the same time a pulse in the second string has been reflected back to the second input of the AND gate, then the flip-flop 20 becomes clocked. After the flip-flop 20 has been clocked, the processor 22 no longer increments the delay of the delay line 16 because the current delay line setting now equals twice the value of $T_{KECFG}$. After the flip-flop 20 has been clocked, it is then reset by the processor 22.

Once $T_{KECFG}$ has been determined, then the time interval $T_{KECF}$ for a pulse to travel along the path connecting the nodes K,E,C and F can be determined from the relationship $$T_{KECF} = T_{KECFG} - T_{FG}$$

where $T_{FG}$ is the propagation delay of the cable 36-1. The propagation delay $T_{FG}$ of the cable 36-1 is usually known. However, if the value for $T_{FG}$ is not known, it can easily be measured using the apparatus 10 in the manner described earlier with respect to FIG. 1.

After determining $T_{KECF}$, then the switches 58 and 60 are closed and opened, respectively, while the switch 48 is actuated to couple the node A to node B. Thereafter, the time $T_{LBRCEK}$ is measured by the measured apparatus 10. Instead of employing the principle of time domain reflectometry to measure $T_{LBRCEK}$, a slightly different technique is employed. A first and second string of periodic pulses are launched by the pulse generator 14 into the cable 52 and the programmable delay line 16, respectively. Each of the pulses in the first string travels along a path or loop connecting the nodes L,B,R,C,E and K, the last node being one of the pair of inputs to the AND gate 18. Each of the pulses in the second string propagates through the delay line 16 before reaching the other of the pair of inputs to the AND gate 18.

While the pulses in the first and second strings propagate along their respective paths, the processor 22 monitors the flip-flop 20 to check whether the flip-flop has been clocked. The flip-flop 22 becomes clocked only when one of the pulses in the first string reaches the AND gate 18 at the same time one of the pulses in the second string does. Until the flip-flop 20 becomes clocked, the processor 22 continues to successively increase the delay of the delay line 16. When the flip-flop 20 becomes clocked, the delay setting of the delay line equals the time $T_{LBRCEK}$.

Once $T_{LBRCEK}$ has been determined, then the time $T_{LBRCFG}$ can be computed from the relationship $$T_{LBRCFG} = T_{LBRCEK} - T_{KECF} + T_{FG}.$$

From a knowledge of the actual value of $T_{LBRCFG}$, the delay line 42-1 can then be adjusted to set $T_{LBRCFG}$ to a predetermined value. This procedure is repeated for each of the other channels 34-2 . . . 34-N to set $T_{LBRCFG}$ for each.

The window-to-drive skew error can be minimized by adjusting the delay line 42-2 of each of the channels 34-1, 34-2, . . . 34-N to compensate for the time lag of the signals captured by the sense circuit 66 within each channel due to the propagation delay of the corresponding one of the cables 36-1, 36-2, . . . 36-N. In order to properly compensate for the cable propagation delay, it is first necessary to account for the time interval $T_{RCDIU}$ for a signal to travel along the path connecting the nodes R,C,D,I and U. In other words, the time $T_{RCDIU}$ is the time required for a pulse to travel between the input (node R) to the logic gate 38-1 and the strobe input (node U) to the sense circuit 62.

To measure the time interval $T_{RCDIU}$, the switch 58 is closed and the switch 66 is actuated to couple node C to node D while the switch 48 is actuated to couple the pulse generator 14 to the distribution matrix 46. Thereafter, the pulse generator 14 supplies a string of successive pulses simultaneously to the inputs (nodes R and S) of the logic gates 40-1 and 40-2. The delay line 42-2 is adjusted until the sense circuit 66 detects the leading edge of each pulse. The time delay setting of the programmable delay line 42-2 after adjustment represents the value of $T_{RCDIU}$. To compensate for the propagation delays incurred by the test and response signals traveling through the cable 36-1, it becomes necessary to increase the delay setting of the delay line 42-2 by twice the value of $T_{FG}$. Once the delay line 42-2 is adjusted for the channel 34-1, then the corresponding delay line within each of the channels 34-2 ... 34-N is adjusted in the same manner.

As thus described, the measurement apparatus 10 can be employed to calibrate the testing machine 24 for the two major types of errors. Such calibration can be carried out automatically by having the processor 22, or another processor, automatically adjust each of the delay lines 42-1 and 42-2 for each of the channels 34-1, 34-2, ... 34-N in the manner described above.

It is to be understood that the above-described embodiments are merely illustrative of the principles of the invention. Various modifications and changes may be made thereto by those skilled in the art which will embody the principles of the invention and fall within the spirit and scope thereof.

What is claimed is:

1. Apparatus for measuring the propagation delay of a signal traveling between a first node and a second node of a circuit path, CHARACTERIZED BY:

means having an input and an output for adjustably delaying a signal passing between said inputs and outputs;

a single signal generator for simultaneously supplying a first string of first pulses to the input of said signal-delaying means and a string of second signal pulses to a first node of a circuit path so that each of said second pulses propagates to a second node on said circuit path;

means for detecting whether any of said first pulses have been delayed by said signal-delaying means by an interval equal to the time required for one of said second pulses to propagate to said second node of said circuit path; and means responsive to the detecting means for increasing the delay of said signal-delaying means until one of said first pulses has been delayed by an interval equal to the time required for one of said second pulses to travel to said second node of said circuit path.

2. The apparatus according to claim 1, CHARACTERIZED IN THAT said delaying means comprises a delay line.

3. The apparatus according to claim 1, CHARACTERIZED IN THAT said detecting means comprises:

a two input AND gate having a first input coupled to the signaldelaying means, a second input coupled to said circuit path, and an output; and a D-type flip-flop having a clock input coupled to the output of said AND gate, said flip-flop producing, at its Q output, a signal whose logic state reflects whether one of the first pulses has been delayed by the same interval as one of the second pulses.

4. In combination with a testing machine having a plurality of channels, each serving to produce a test signal transmitted through a transmission media to a circuit board which, in response, generates a response signal carried by the transmission media to the channel for analysis thereby, apparatus for measuring the propagation delay of the signal propagating through said transmission media to allow each channel to be compensated for the propagation delay, said apparatus CHARACTERIZED BY:

means having an input and an output for adjustably delaying a signal passing between its input and output;

a single signal generator for simultaneously supplying a string of first pulses to said signal-delaying means and string of second signal pulses to a first end of a transmission media which has its opposite end open so that each of said second pulses propagates to said open end of said transmission media and is reflected therefrom back to said first end;

means for detecting whether any of said first pulses have been delayed by said signal-delaying means by an interval equal to the time required for one of said second pulses to propagate to and from said open end of said transmission media; and means responsive to the detecting means for increasing the delay of said signal-delaying means until one of said first pulses has been delayed by an interval equal to the time required for one of said second pulses to travel to and from the open end of the transmission media.

5. The apparatus according to claim 4, CHARACTERIZED IN THAT said delaying means comprises a delay line.

6. The apparatus according to claim 4, CHARACTERIZED IN THAT said detecting means comprises:

a two input AND gate having a first input coupled to said signaldelaying means, a second input coupled to said first end of said transmission media, and an output; and a D-type flip-flop having a clock input coupled to the output of said AND gate, said flip-flop producing, at its Q output, a signal whose logic state reflects whether one of the first pulses has been delayed by the same interval as one of the second pulses.

* * * * *